US 9,478,689 B2

(12) United States Patent
Huang et al.

(10) Patent No.: US 9,478,689 B2
(45) Date of Patent: Oct. 25, 2016

(54) HIGH-SPEED GERMANIUM ON SILICON AVALANCHE PHOTODIODE

(71) Applicant: SiFotonics Technologies Co., Ltd., Grand Cayman (KY)

(72) Inventors: Mengyuan Huang, Beijing (CN); Pengfei Cai, Beijing (CN); Liangbo Wang, Beijing (CN); Su Li, Beijing (CN); Wang Chen, Beijing (CN); Ching-yin Hong, Lexington, MA (US); Dong Pan, Andover, MA (US)

(73) Assignee: SIFOTONICS TECHNOLOGIES CO., LTD., Grand Cayman (KY)

( * ) Notice: Subject to any disclaimer, the term of this patent is extended or adjusted under 35 U.S.C. 154(b) by 0 days.

(21) Appl. No.: 14/961,675

(22) Filed: Dec. 7, 2015

(65) Prior Publication Data

US 2016/0172525 A1    Jun. 16, 2016

Related U.S. Application Data

(60) Provisional application No. 62/124,174, filed on Dec. 10, 2014.

(51) Int. Cl.
*H01L 31/107* (2006.01)
*H01L 31/0392* (2006.01)

(52) U.S. Cl.
CPC ..... *H01L 31/1075* (2013.01); *H01L 31/03921* (2013.01)

(58) Field of Classification Search
None
See application file for complete search history.

(56) References Cited

U.S. PATENT DOCUMENTS

| 7,521,737 | B2* | 4/2009 | Augusto | H01L 27/14643 257/184 |
| 8,664,739 | B2* | 3/2014 | King | H01L 27/14632 257/186 |
| 2005/0167709 | A1* | 8/2005 | Augusto | H01L 27/14643 257/292 |
| 2013/0292741 | A1* | 11/2013 | Huang | H01L 31/1075 257/186 |

OTHER PUBLICATIONS

Kang et al. "Monolithic Ge/Si Avalance Photodiode Receiver for 100Gb/s 1.3 um Application"; 2008, IEEE, pp. 292-293.*

* cited by examiner

*Primary Examiner* — Scott B Geyer
(74) *Attorney, Agent, or Firm* — Han IP Corporation; Andy M. Han

(57) ABSTRACT

A high-speed germanium on silicon (Ge/Si) avalanche photodiode may include a substrate layer, a bottom contact layer disposed on the substrate layer, a buffer layer disposed on the bottom contact layer, an electric field control layer disposed on the buffer layer, an avalanche layer disposed on the electric field control layer, a charge layer disposed on the avalanche layer, an absorption layer disposed on the charge layer, and a top contact layer disposed on the absorption layer. The electric field contact layer may be configured to control an electric field in the avalanche layer.

20 Claims, 7 Drawing Sheets

HIGH-SPEED GERMANIUM ON SILICON AVALANCHE PHOTODIODE

CROSS-REFERENCE TO RELATED PATENT APPLICATION(S)

The present disclosure is a non-provisional application of, and claims the priority benefit of, U.S. Provisional Patent Application No. 62/124,174, filed on 10 Dec. 2014, which is herein incorporated by reference in its entirety.

TECHNICAL FIELD

The present disclosure is related to photonic devices. More particularly, the present disclosure is related to a high-speed germanium on silicon avalanche photodiode.

BACKGROUND

For high-speed avalanche photodiode operating at data rate of 25 GHz or beyond, typically a thin avalanche layer is needed for reducing the buildup time in the avalanche layer. A conventional structure of a germanium (Ge) on silicon (Si) avalanche photodiode (Ge/Si APD) is shown in FIG. 6. However, this conventional structure tends to encounter some problems when Si avalanche layer becomes very thin (e.g., 100 nm). Firstly, a thin Si layer leads to the reduction of thickness of depleted region and results in increment of capacitance, thereby increasing the RC time and reducing the bandwidth of the photodiode. Secondly, a thin intrinsic Si avalanche layer tends to be greatly impacted by the n+ bottom Si contact layer. Silicon is different from III-V material and has a relatively high density of state in the conduction band ($2.9 \times 10^{19}/cm^3$) at 300K, which means it typically requires a heavily doped Si (such as $1 \times 10^{19}/cm^3$) to form contact layer. On the other hand, the intrinsic Si avalanche layer should have very low doping concentration (such as $1 \times 10^{15}/cm^3$) for making a uniform electric field inside the avalanche layer. The existence of huge concentration difference between intrinsic Si (i-Si) layer and heavily n+ doped Si (n+Si) layer tends to cause carrier diffusion or auto doping effect during epitaxial growth, and these will affect the doping profile in avalanche layer and then affect thickness of depleted region and impact the electric field as shown in FIG. 7.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

In one aspect, an apparatus may include a Ge/Si avalanche photodiode. The Ge/Si avalanche photodiode may include a bottom contact layer disposed on the substrate layer, a buffer layer disposed on the bottom contact layer, an electric field control layer disposed on the buffer layer, an avalanche layer disposed on the electric field control layer, a charge layer disposed on the avalanche layer, an absorption layer disposed on the charge layer, and a top contact layer disposed on the absorption layer. The electric field contact layer may be configured to control an electric field in the avalanche layer.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

The present disclosure provides various implementations of a novel Ge/Si APD structure that solves the aforementioned problems associated with conventional designs of Ge/Si APD.

Figure 1:
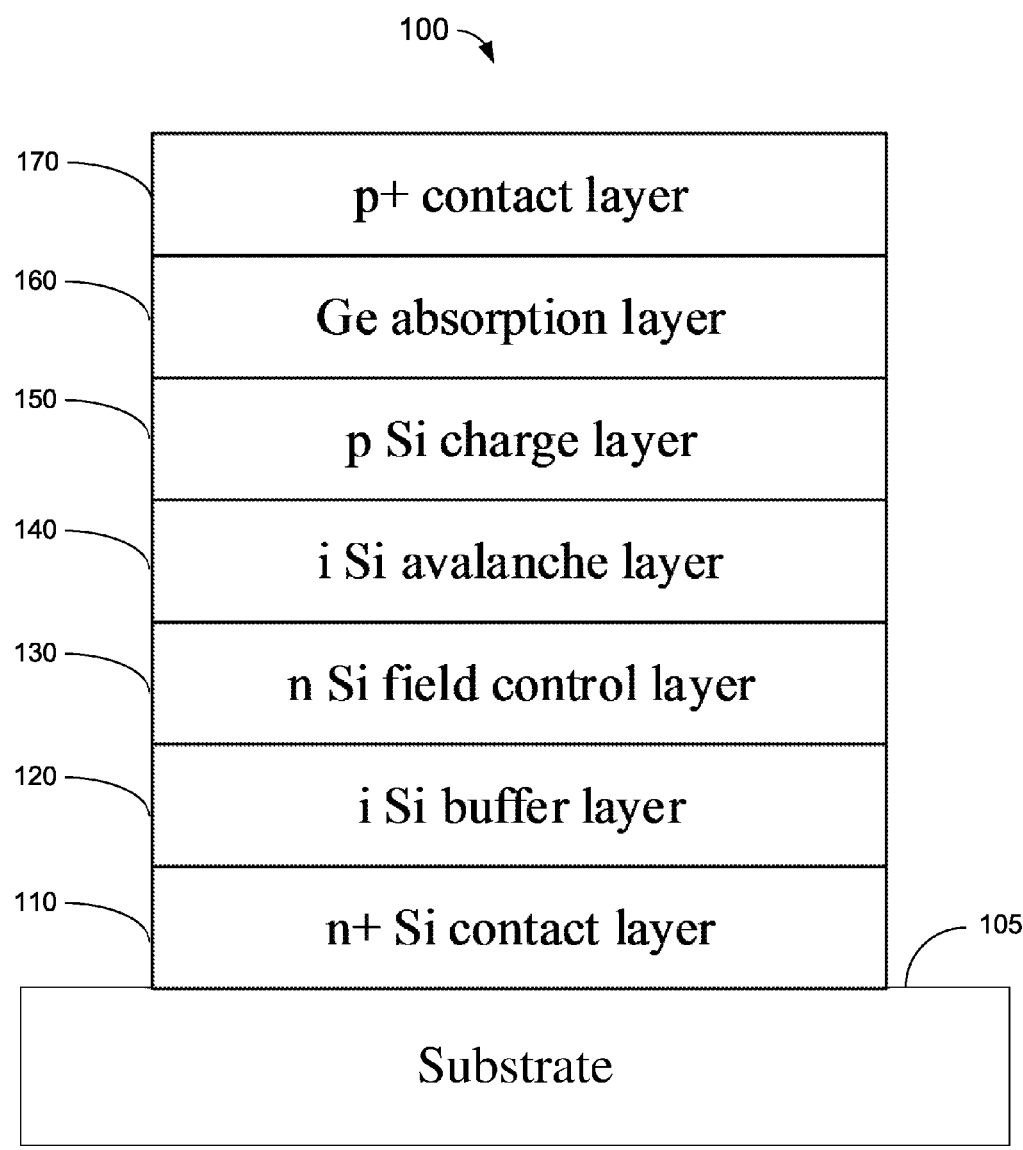
FIG. 1 is a cross-sectional view of a Ge/Si APD structure in accordance with an embodiment of the present disclosure.

FIG. 1 illustrates a Ge/Si APD structure 100 in accordance with an embodiment of the present disclosure. Referring to FIG. 1, Ge/Si APD structure 100 may include a substrate layer 105, a bottom contact layer 110, a buffer layer 120, an electric field control layer 130, an avalanche layer 140, a charge layer 150, an absorption layer 160 and a top contact layer 170. The substrate layer 105 may be made from a bulk Si wafer or a silicon-on-insulator (SOI) wafer. The bottom contact layer 110 may be a heavily n-doped (n+) Si contact layer. The buffer layer 120 may be an intrinsic Si (i-Si) buffer layer. The electric field control layer 130 may be an n-doped Si electric field contact layer configured to control an electric field in the avalanche layer 140. The avalanche layer 140 may be an intrinsic Si (i-Si) avalanche layer. The charge layer 150 may be a p-doped Si charge layer. The absorption layer 160 may be a Ge absorption layer, and may include Ge, GeSn, GeSi, GeSiSn or one or more other III-V compound semiconductor materials. The top contact layer 170 may be a heavily p-doped (p+) amorphous Si (a-Si) contact layer. In some implementations, the electric field control layer 130 may be formed from a depleted electric field control layer.

Figure 2:
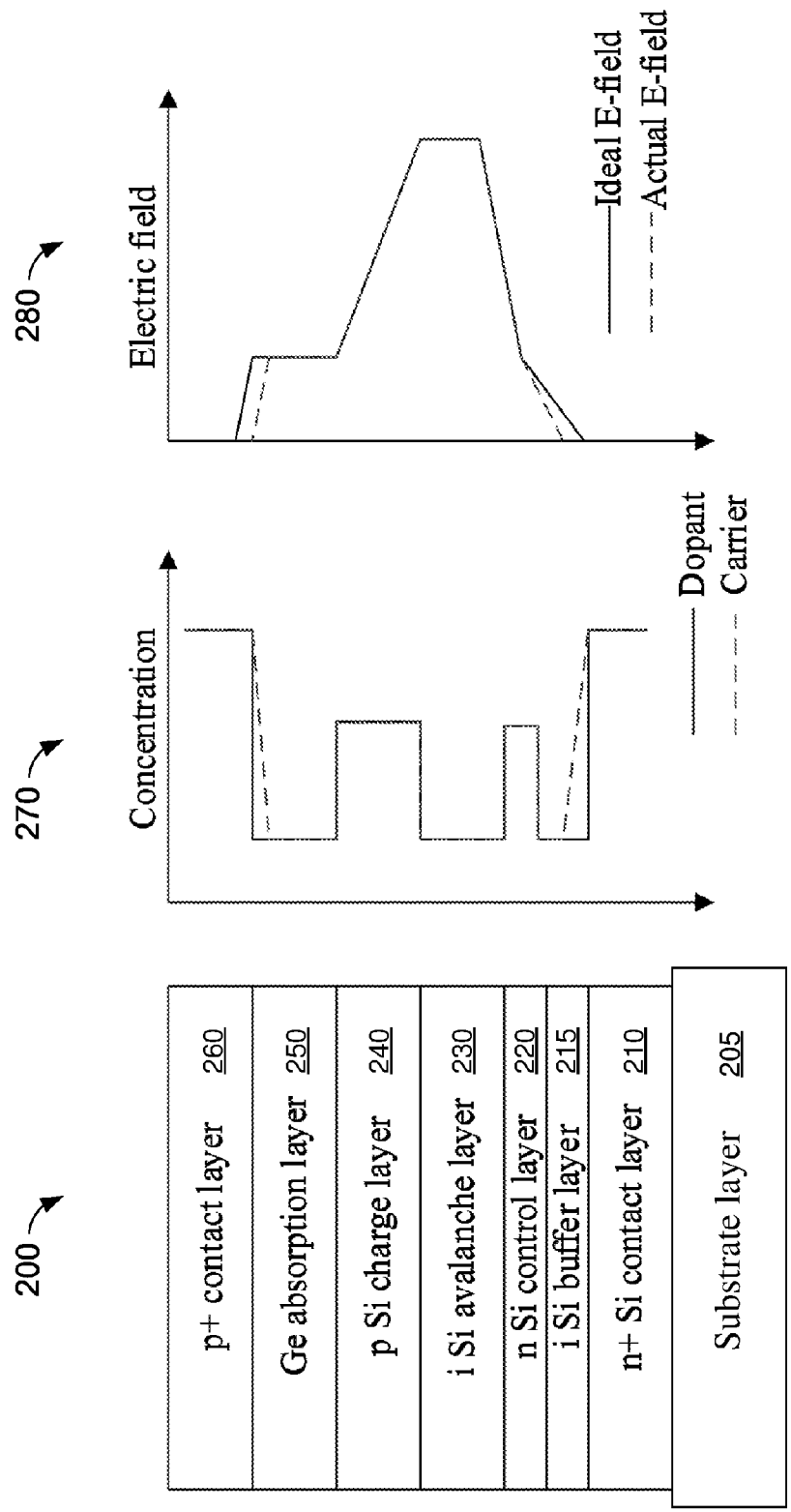
FIG. 2 is a cross-sectional view of a Ge/Si APD structure and its doping concentration and electric field in accordance with another embodiment of the present disclosure.

FIG. 2 illustrates a Ge/Si APD structure 200 and its doping concentration 270 and electric field 280 in accordance with another embodiment of the present disclosure.

Ge/Si APD structure 200 may be a variation of Ge/Si APD structure 100. Referring to FIG. 2, Ge/Si APD structure 200 may include a substrate layer 205, a bottom contact layer 210, a buffer layer 215, a field control layer 220, an avalanche layer 230, a charge layer 240, an absorption layer 250 and a top contact layer 260. The substrate layer 205 may be made from a bulk Si wafer or a SOI wafer. The bottom contact layer 210 may be a heavily n-doped (n+) Si contact layer. The buffer layer 215 may be an intrinsic Si layer. The field control layer 220 may be an n-doped Si electric field contact layer configured to control an electric field in the avalanche layer 230. The avalanche layer 230 may be an intrinsic Si (i-Si) avalanche layer. The charge layer 240 may be a p-doped Si charge layer. The absorption layer 250 may be a Ge absorption layer, and may include Ge, GeSn, GeSi, GeSiSn or one or more other III-V compound semiconductor materials. The top contact layer 260 may be a heavily p-doped (p+) amorphous Si (a-Si) contact layer. In some implementations, the electric field control layer 220 may be formed from a depleted electric field control layer.

In this design, compared to Ge/Si APD structure 100, Ge/Si APD structure 200 may additionally include an intrinsic Si (i-Si) buffer layer 215 which may form an improved n-doped Si electric field control layer with the electric field control layer 220. During operations, the n-Si electric field control layer 220 may be completely depleted and the i-Si buffer layer 215 may be partially or completely depleted. Accordingly, carrier diffusion from bottom may impact the i-Si buffer layer 215 without affecting the avalanche layer 230.

In some implementations, a total thickness of the i-Si buffer layer 215 may be determined by, or corresponds to, an electron transit time. In some implementations, the electron transit time in the i-Si buffer layer 215 may be less than or equal to the total transit time of hole transporting in depleted n-Si field control layer 220, i-Si avalanche layer 230, p-doped Si charge layer 240 and Ge absorption layer 250.

Figure 3:
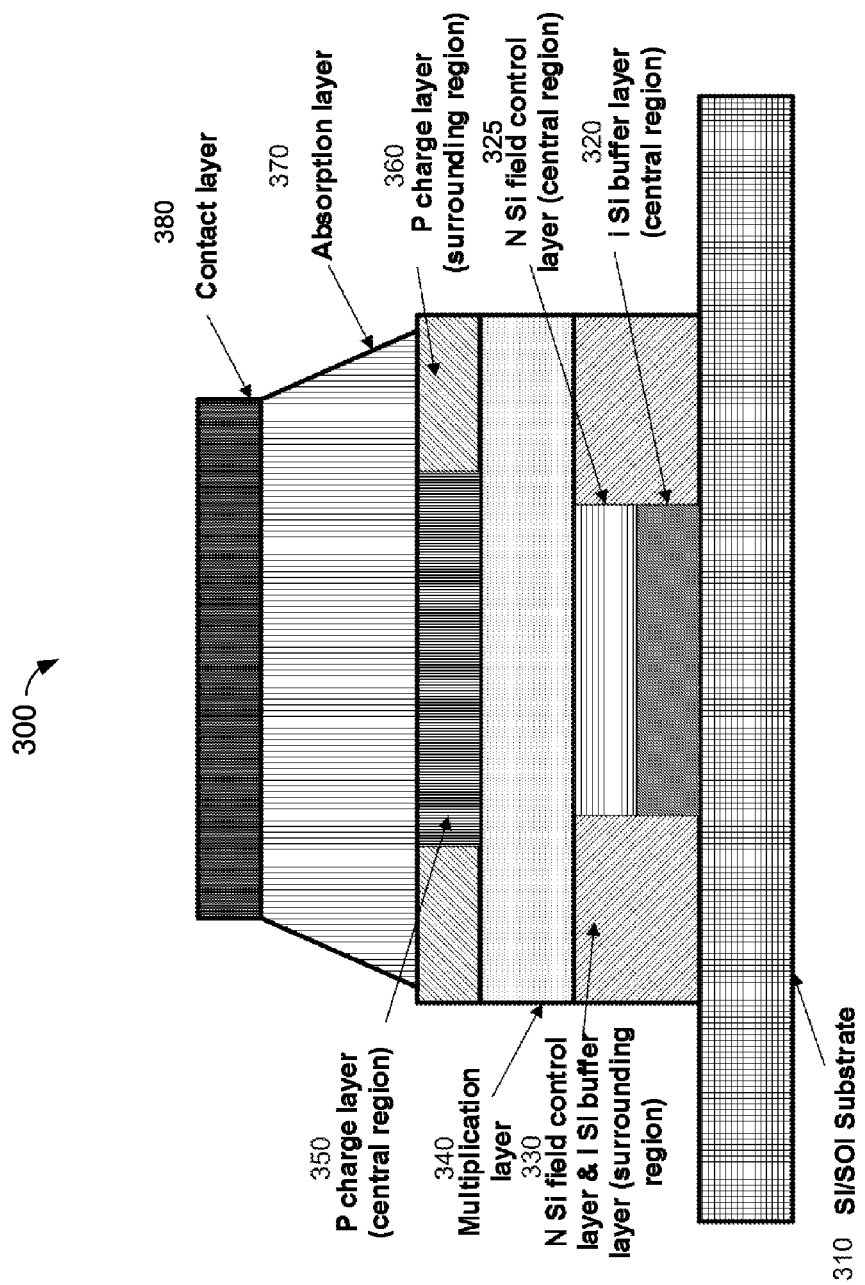
FIG. 3 is a cross-sectional view of a Ge/Si APD structure in accordance with yet another embodiment of the present disclosure.

FIG. 3 illustrates a Ge/Si APD structure 300 in accordance with yet another embodiment of the present disclosure. Ge/Si APD structure 300 may be a variation of Ge/Si APD structure 100 and/or Ge/Si APD structure 200. Referring to FIG. 3, Ge/Si APD structure 300 may include a substrate 310, a combined electric field control and buffer layer, avalanche multiplication layer 340, a charge layer, an absorption layer 370 and a top contact layer 380. The substrate 310 may be a Si substrate made from a bulk Si wafer or a SOI substrate made from a SOI wafer. The combined electric field control and buffer layer may be configured to control an electric field in the multiplication layer 340. The multiplication layer 340 may be an intrinsic Si (i-Si) avalanche layer. The charge layer may be a p-doped Si (p-Si) charge layer. The absorption layer 370 may be a Ge absorption layer. The top contact layer 380 may be a heavily p-doped (p+) amorphous Si (a-Si) contact layer. In some implementations, the electric field control layer may be formed from a depleted electric field control layer.

In some implementations, under some circumstances, a doping concentration of Ge/Si APD structure 300 may have a vertical difference and some lateral distribution. For instance, the combined electric field control and buffer layer may be doped in a central region thereof with a surrounding region 330 that surrounds the central region. The surrounding region 330 may be kept intrinsic. The central region of the combined electric field control and buffer layer may be an active/sensitive region for optical signals. In some implementations, similar to Ge/Si APD structure 200 and as shown in FIG. 3, at least the central region of the combined electric field control and buffer layer of Ge/Si APD structure 300 may include an intrinsic Si (i-Si) buffer layer 320 and an n-doped Si (n-Si) electric field control layer 325.

In some implementations, the charge layer may include a central region 350 and a surrounding region 360 that surrounds the central region 350. A doping concentration in the surrounding region 360 may be higher than that a doping concentration in the central region 350.

In some implementations, a thickness of the i-Si multiplication layer 340 may be in a range of approximately 50 nm~250 nm with a doping concentration less than or equal to $5 \times 10^{16}/cm^3$. In some implementations, a thickness of the p-Si charge layer may be in a range of approximately 30 nm~150 nm with a doping concentration of $1 \times 10^{17}/cm^3 \sim 5 \times 10^{18}/cm^3$. In some implementations, a thickness of the electric field control layer may be in a range of approximately 50 nm~400 nm with a doping concentration of $5 \times 10^{16}/cm^3 \sim 3 \times 10^{18}/cm^3$. In some implementations, a thickness of the i-Si buffer layer may be in a range of approximately 100 nm~600 nm with a doping concentration of $1 \times 10^{15}/cm^3 \sim 1 \times 10^{19}/cm^3$.

In some implementations, the absorption layer 370 may include Ge, GeSn, GeSi, GeSiSn or one or more other III-V compound semiconductor materials.

Each of Ge/Si APD structure 100, Ge/Si APD structure 200 and Ge/Si APD structure 300 may be implemented in a device or apparatus. In some implementations, a type of the device may be either normal incident device or waveguide device.

Figure 4:
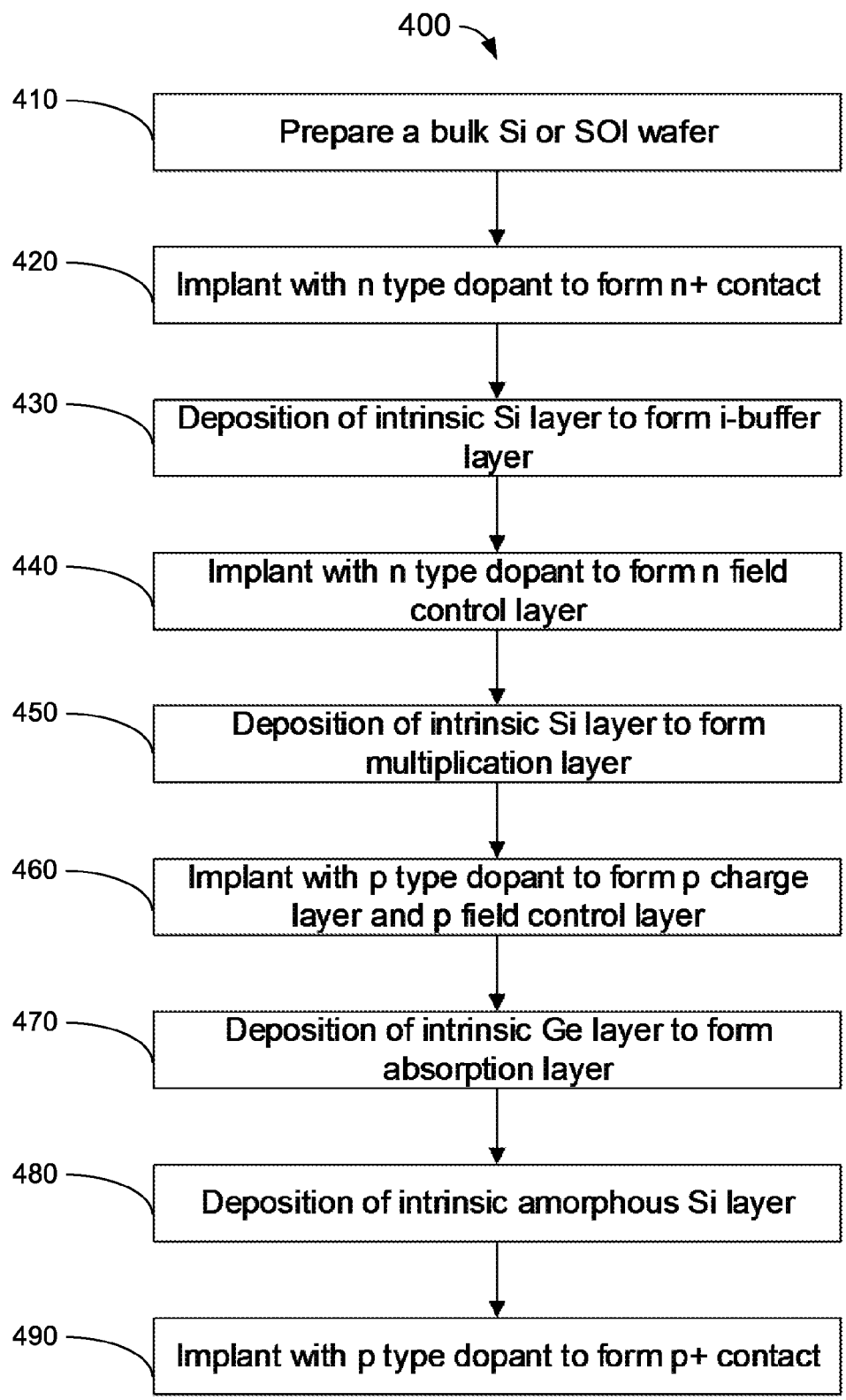
FIG. 4 is a flowchart of a manufacturing process of a Ge/Si APD in accordance with another embodiment of the present disclosure.

FIG. 4 illustrates a manufacturing process 400 of a Ge/Si APD in accordance with another embodiment of the present disclosure. For instance, process 400 may be utilized to manufacture Ge/Si APD structure 100, Ge/Si APD structure 200 and/or Ge/Si APD structure 300. Process 400 may include one or more operations, actions, or functions as represented by one or more blocks such as blocks 410-490. Although illustrated as discrete blocks, various blocks of process 400 may be divided into additional blocks, combined into fewer blocks, or eliminated, depending on the desired implementation. The blocks may be performed in the order shown in FIG. 4 or in any other order, depending on the desired implementation.

At 410, process 400 may involve preparing a bulk Si or SOI wafer.

At 420, process 400 may involve implanting the wafer with n-type dopants to form an n+ bottom contact layer.

At 430, process 400 may involve depositing an intrinsic Si layer on the bottom contact layer to form an intrinsic Si (i-Si) buffer layer.

At 440, process 400 may involve implanting a portion of the intrinsic buffer layer with n-type dopants to form an n-doped electric field control layer.

At 450, process 400 may involve depositing an intrinsic Si layer on the electric field control layer to form a multiplication layer.

At 460, process 400 may involve implanting a portion of the multiplication layer with p-type dopants to form a p-type charge layer and a p-type electric field control layer.

At 470, process 400 may involve depositing an intrinsic Ge layer on the charge layer to form an absorption layer.

At 480, process 400 may involve depositing an intrinsic amorphous Si layer on the absorption layer.

At 490, process 400 may involve implanting the amorphous Si layer with p-type dopants to form a heavily p-doped (p+) top contact layer.

Figure 5:
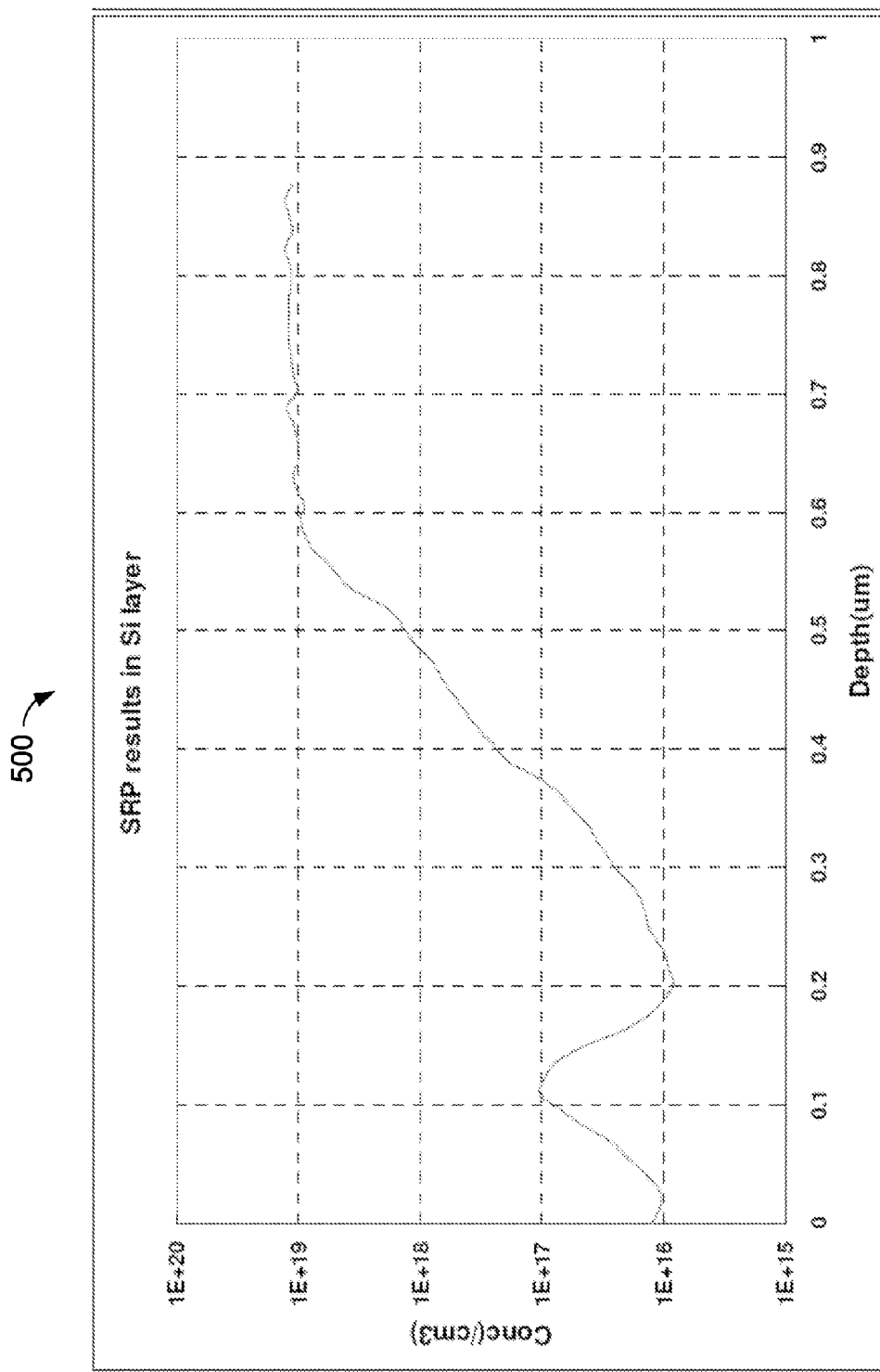
FIG. 5 is a chart of a measured spreading resistance profile of a Ge/Si APD in accordance with another embodiment of the present disclosure.
Figure 6:
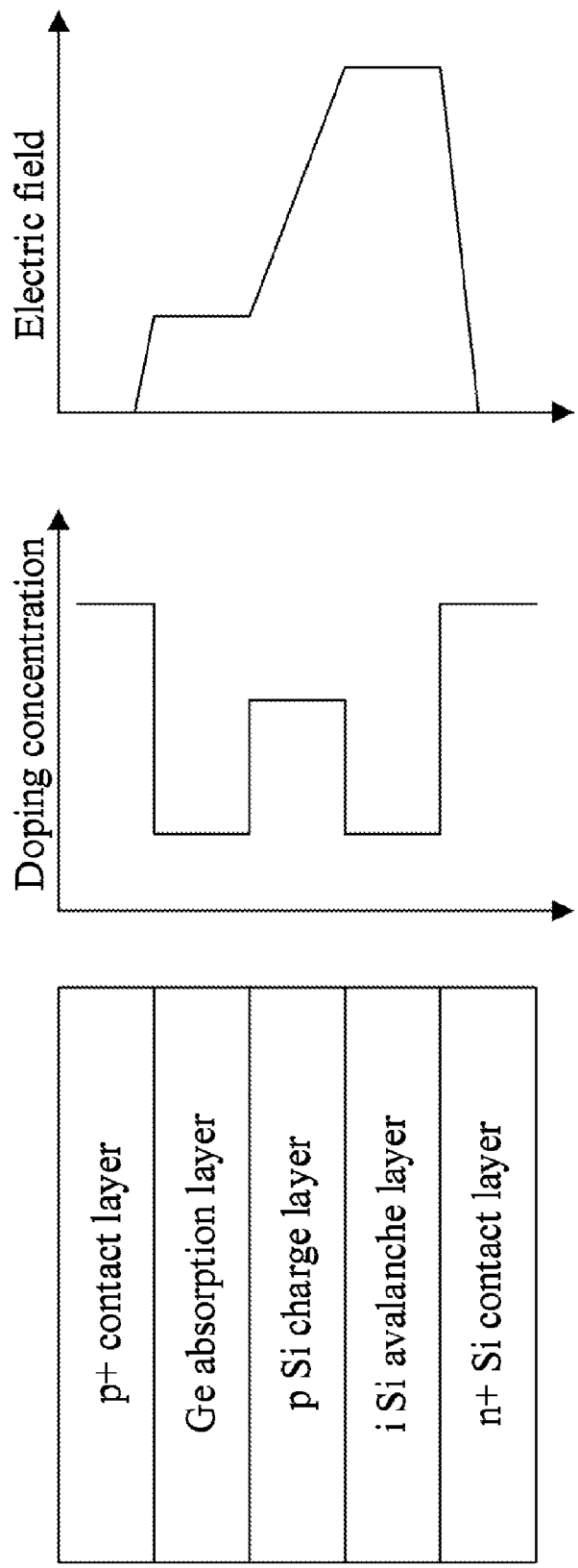
FIG. 6 is a cross-sectional view of a conventional Ge/Si APD structure and its doping concentration and electric field.
Figure 7:
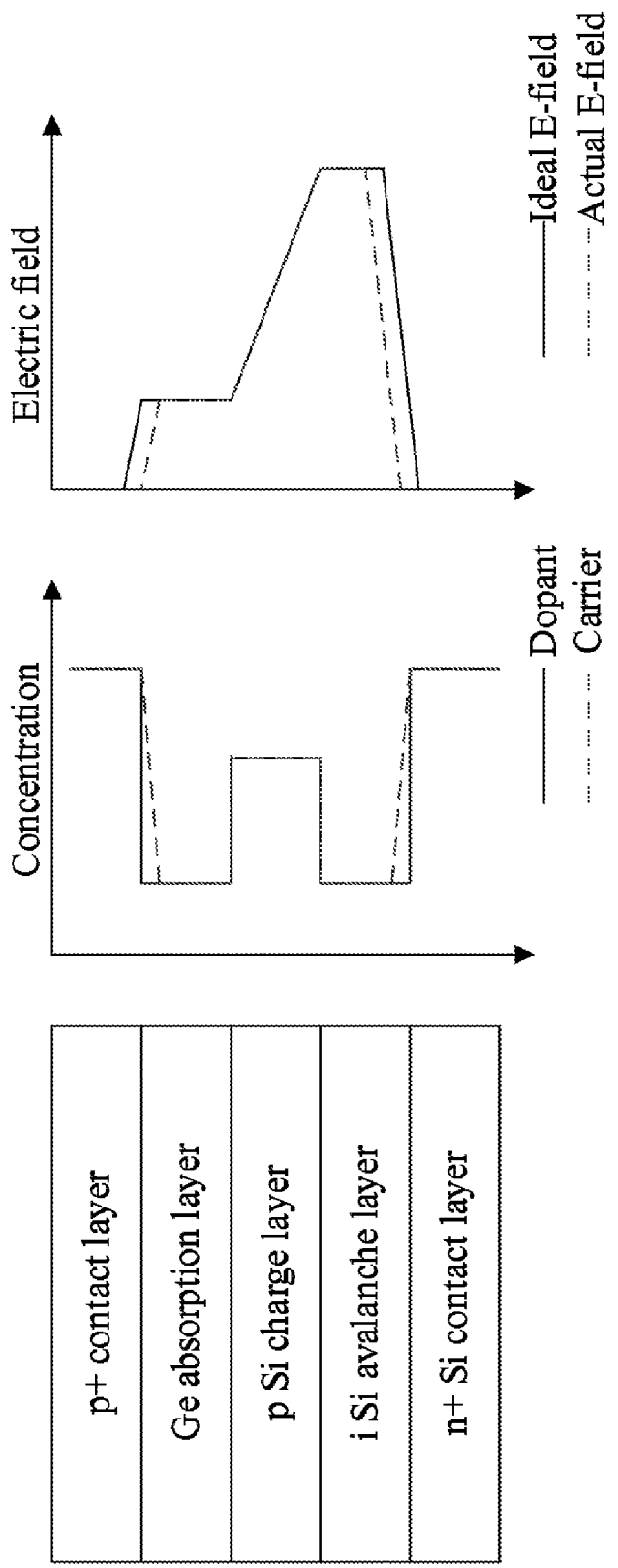
FIG. 7 is a cross-sectional view of another conventional Ge/Si APD structure and its doping concentration and electric field.

FIG. 5 shows a chart 500 of a measured spreading resistance profile (SRP) of a Ge/Si APD in accordance with another embodiment of the present disclosure. Referring to FIG. 5, for depth less than 0.07 um, the measured SRP is that of an i-Si avalanche layer. For depth between 0.07 um and 0.17 um, the measured SRP is that of an n-Si electric field control layer. For depth between 0.17 um and 0.6 um, the measured SRP is that of an i-Si buffer layer after auto-doping and free carrier diffusion. For depth between 0.6 um and 0.9 um, the measured SRP is that of an n+ bottom contact layer.

Highlight of Features

In view of the above, select features of various implementations of the present disclosure are listed below.

In one aspect, an apparatus may include a Ge/Si avalanche photodiode. The Ge/Si avalanche photodiode may include a bottom contact layer, a buffer layer disposed on the bottom contact layer, an electric field control layer disposed on the buffer layer, an avalanche layer disposed on the electric field control layer, a charge layer disposed on the avalanche layer, an absorption layer disposed on the charge layer, and a top contact layer disposed on the absorption layer. The electric field contact layer may be configured to control an electric field in the avalanche layer.

In some implementations, the bottom contact layer may include a Si contact layer heavily doped with n-type dopants. The buffer layer may include an intrinsic Si layer with unintentional doping. The electric field control layer may include a Si electric field control layer doped with n-type dopants. The avalanche layer may include an intrinsic Si avalanche layer. The charge layer may include a Si charge layer doped with p-type dopants. The absorption layer may include a Ge absorption layer. The top contact layer may include an amorphous Si contact layer heavily doped with p-type dopants.

In some implementations, the electric field control layer may include a depleted electric field control layer.

In some implementations, a thickness of the intrinsic Si buffer layer may be in a range of approximately 100 nm~600 nm with a doping concentration of $1 \times 10^{15}/cm^3 \sim 1 \times 10^{19}/cm^3$.

In some implementations, a total thickness of the electric field control layer may correspond to an electron transit time in the buffer layer. In some implementations, the electron transit time in the buffer layer may be less than or equal to a total transit time of hole transporting in the n field control layer, avalanche layer, the charge layer, and the absorption layer.

In some implementations, the electric field control layer may include a first central region and a first surrounding region that surrounds the first central region. The first central region may be doped and may function as an active region for optical signals. The first surrounding region may be intrinsic. In some implementations, the first central region may be doped with n-type dopants.

In some implementations, the charge layer may include a second central region and a second surrounding region that surrounds the second central region. A doping concentration of the second surrounding region may be greater than a doping concentration of the second central region. In some implementations, the second central region and the second surrounding region may be doped with p-type dopants.

In some implementations, a thickness of the avalanche layer may be in a range of approximately 50 nm~250 nm.

In some implementations, a doping concentration of the avalanche layer may be less than or equal to $5 \times 10^{16}/cm^3$.

In some implementations, a thickness of the charge layer may be in a range of approximately 30 nm~150 nm.

In some implementations, a doping concentration of the charge layer may be in a range of approximately $1 \times 10^{17}/cm^3 \sim 5 \times 10^{18}/cm^3$.

In some implementations, a thickness of the electric field control layer may be in a range of approximately 50 nm~400 nm.

In some implementations, a doping concentration of the electric field control layer may be in a range of approximately $5 \times 10^{16}/cm^3 \sim 3 \times 10^{18}/cm^3$.

In some implementations, a thickness of the buffer layer may be in a range of approximately 100 nm~600 nm.

In some implementations, a doping concentration of the buffer layer may be in a range of approximately $1 \times 10^{15}/cm^3 \sim 1 \times 10^{19}/cm^3$.

In some implementations, the Ge/Si avalanche photodiode may include a normal incident device. Alternatively, the Ge/Si avalanche photodiode may include a waveguide device.

In some implementations, the absorption layer may include Ge, GeSn, GeSi, GeSiSn or one or more other III-V compound semiconductor materials.

ADDITIONAL NOTES

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An apparatus, comprising:
   a germanium on silicon (Ge/Si) avalanche photodiode comprising:
   a substrate;
   a bottom contact layer disposed on the substrate;
   a buffer layer disposed on the bottom contact layer;
   an electric field control layer disposed on the buffer layer;
   an avalanche layer disposed on the electric field control layer;
   a charge layer disposed on the avalanche layer;
   an absorption layer disposed on the charge layer; and
   a top contact layer disposed on the absorption layer,
   wherein the electric field contact layer is configured to control an electric field in the avalanche layer.

2. The apparatus of claim 1, wherein the substrate comprises a bulk Si wafer or a silicon on insulator (SOI) wafer, wherein the bottom contact layer comprises a Si contact layer heavily doped with n-type dopants, wherein the buffer layer comprises an intrinsic Si layer with unintentional doping, an electric field control layer comprises a Si electric field control layer doped with n-type dopants, wherein the avalanche layer comprises an intrinsic Si avalanche layer, wherein the charge layer comprises a Si charge layer doped with p-type dopants, wherein the absorption layer comprises a Ge absorption layer, and wherein the top contact layer comprises an amorphous Si contact layer heavily doped with p-type dopants.

3. The apparatus of claim 1, wherein the electric field control layer comprises a depleted electric field control layer.

4. The apparatus of claim 1, wherein a total thickness of the buffer layer corresponds to an electron transit time in the buffer layer.

5. The apparatus of claim 4, wherein the electron transit time in the buffer layer is less than or equal to a total transit time of hole transporting in the n field control layer, the avalanche layer, the charge layer, and the absorption layer.

6. The apparatus of claim 1, wherein the electric field control layer comprises a first central region and a first surrounding region that surrounds the first central region, wherein the first central region is doped and functions as an active region for optical signals, and wherein the first surrounding region is intrinsic.

7. The apparatus of claim 6, wherein the first central region is doped with n-type dopants.

8. The apparatus of claim 6, wherein the charge layer comprises a second central region and a second surrounding region that surrounds the second central region, wherein a doping concentration of the second surrounding region is greater than a doping concentration of the second central region.

9. The apparatus of claim 8, wherein the second central region and the second surrounding region are doped with p-type dopants.

10. The apparatus of claim 1, wherein a thickness of the avalanche layer is in a range of approximately 50 nm~250 nm.

11. The apparatus of claim 10, wherein a doping concentration of the avalanche layer is less than or equal to $5 \times 10^{16}/cm^3$.

12. The apparatus of claim 1, wherein a thickness of the charge layer is in a range of approximately 30 nm~150 nm.

13. The apparatus of claim 12, wherein a doping concentration of the charge layer is in a range of approximately $1 \times 10^{17}/cm^3 \sim 5 \times 10^{18}/cm^3$.

14. The apparatus of claim 1, wherein a thickness of the electric field control layer is in a range of approximately 50 nm~400 nm.

15. The apparatus of claim 14, wherein a doping concentration of the electric field control layer is in a range of approximately $5 \times 10^{16}/cm^3 \sim 3 \times 10^{18}/cm^3$.

16. The apparatus of claim 1, wherein a thickness of the buffer layer is in a range of approximately 100 nm~600 nm.

17. The apparatus of claim 16, wherein a doping concentration of the buffer layer is in a range of $1 \times 10^{15}/cm^3 \sim 1 \times 10^{19}/cm^3$.

18. The apparatus of claim 1, wherein the Ge/Si avalanche photodiode comprises a normal incident device.

19. The apparatus of claim 1, wherein the Ge/Si avalanche photodiode comprises a waveguide device.

20. The apparatus of claim 1, wherein the absorption layer comprises Ge, GeSn, GeSi, GeSiSn or one or more other III-V compound semiconductor materials.

* * * * *